United States Patent [19]

Esser et al.

[11] Patent Number: 4,799,109
[45] Date of Patent: Jan. 17, 1989

[54] CHARGE COUPLED SENSOR ARRANGEMENT

[75] Inventors: Leonard J. M. Esser; Marcellinus J. M. Pelgrom, both of Eindhoven, Netherlands

[73] Assignee: U.S. Philips Corp., New York, N.Y.

[21] Appl. No.: 149,981

[22] Filed: Jan. 27, 1988

Related U.S. Application Data

[63] Continuation of Ser. No. 824,029, Jan. 30, 1986, abandoned.

[30] Foreign Application Priority Data

Feb. 7, 1985 [NL] Netherlands ............... 8500337

[51] Int. Cl.⁴ .................................. H04N 3/14
[52] U.S. Cl. ...................... 358/213.28; 358/213.26; 358/213.22
[58] Field of Search ............ 358/213.22, 213.26, 358/213.28, 213.29, 213.31, 213.23, 213.25; 357/24 LR; 377/60, 62, 75, 76

[56] References Cited

U.S. PATENT DOCUMENTS

| | | | |
|---|---|---|---|
| 4,071,853 | 1/1978 | Yamanaka | 358/213.22 |
| 4,242,700 | 12/1980 | Weimer | 358/213.26 |
| 4,246,591 | 1/1981 | Kosonocky et al. | 357/24 M |
| 4,267,469 | 5/1981 | Ohba et al. | 357/24 LR |
| 4,577,232 | 3/1986 | Hynecek | 358/213.26 |
| 4,594,612 | 6/1986 | Levine | 358/213.26 |
| 4,612,579 | 9/1986 | Erhardt | 358/213.26 |
| 4,612,580 | 9/1986 | Weimer | 358/213.26 |
| 4,656,518 | 4/1987 | Kosonocky et al. | 358/213.22 |
| 4,720,746 | 1/1988 | Moore | 358/213.28 |
| 4,737,841 | 4/1988 | Kinoshita et al. | 358/213.26 |

FOREIGN PATENT DOCUMENTS

59-45721 3/1984 Japan ................ 307/452

Primary Examiner—Jin F. Ng
Assistant Examiner—Stephen Brinich
Attorney, Agent, or Firm—Thomas A. Briody; Jack E. Haken

[57] ABSTRACT

The invention relates to a charge-coupled image sensor of the line transfer type comprising a number of parallel lines (2–6) which are each constituted by an n-phase CCD. An electrode (12–16) of each CCD is arranged parallel to this CCD separately for each CCD. The other (n−1) electrodes (17–20) extend transversely to the charge transport direction over all CCD's. The first-mentioned electrode (12–16) is used as a selection gate and is moreover used, depending upon the applied voltage, as an integration gate or as a blocking gate during the integration period.

5 Claims, 5 Drawing Sheets

CHARGE COUPLED SENSOR ARRANGEMENT

This is a continuation of co-pending application Ser. No. 824,029 filed on Jan. 10, 1986, now abandoned.

BACKGROUND OF THE INVENTION

The invention relates to a charge-coupled image sensor arrangement of the line transfer type comprising a semiconductor body which is provided at a surface with a system of adjacent parallel n-phase charge-coupled devices. Each charge-coupled device forms a line of a bidimensional pattern of photosensitive elements (pixels), in which incident radiation of a radiation image can be converted into a charge packet, whose size is determined by the intensity of the incident radiation. These charge-coupled devices comprise an n-phase clock electrode system having electrodes which alternately belong to one of the said phases, while the electrodes of a first of the said n phases for each charge-coupled device can be controlled selectively and the electrodes of the remaining (n−1) phases are common to the whole system. As a result, when a suitable voltage is applied to the electrodes of the first phase of a selected charge-coupled device, a selected line of the bidimensional pattern can be read. The charge packets of the unselected lines are permanently stored in the corresponding charge-coupled devices.

The charge-coupled devices can be of the known surface channel type or buried channel type. The device can further be a usual two-, three- or four-phase system.

Such image sensor arrangements are known, for example, from U.S. Pat. No. 4,242,700. In these arrangements, the image recorded and converted into a charge packet is read line-sequentially by clocking selectively the relevant charge-coupled device. After reading, this charge-coupled device is ready again, if desired, for again recording a line of the image, while at the same time the remaining lines are read. In contrast with more usual charge-coupled image sensor arrangements of the frame transfer type or interline type, in which the generated charge pattern is temporarily stored in a memory before being read, a sensor arrangement of the line transfer type does not require a separate memory. This means either that the whole surface area of the chip can be smaller than in frame transfer arrangements or interline arrangements or that with unchanged surface area the photosensitive part of the whole chip surface area can be comparatively larger.

Figure 4:
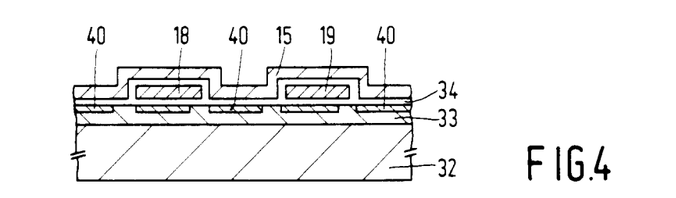
FIG. 4 is a sectional view of this arrangement taken on the line IV—IV in FIG. 2.
Figure 5:
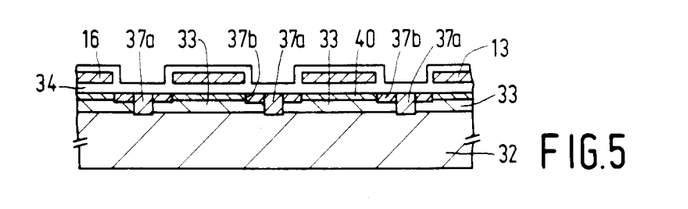
FIG. 5 is a sectional view of this arrangement taken on the line V—V in FIG. 2.
Figure 6:
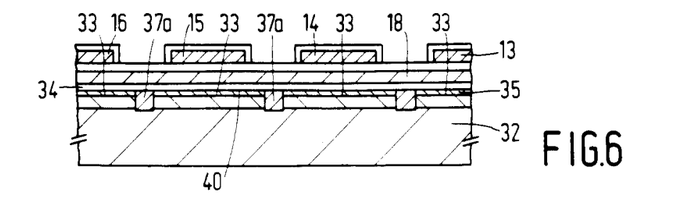
FIG. 6 is a sectional view of this arrangement taken on the line VI—VI in FIG. 2.

The aforementioned U.S. Patent discloses with reference to FIG. 4 and the following Figures a two-phase embodiment, in which a fixed voltage is applied to the common electrodes and in which an alternating voltage, which is alternately higher and lower than the said fixed voltage, is applied to the electrodes of the first phase of a selected line. This voltage is chosen so that generated charge carriers are stored in potential wells below the common electrodes defining the centre of the pixels. The electrode configuration is such that the pixels in adjacent lines are shifted by a half pitch with respect to each other. When reading the matrix, each time two successive lines are read in time division multiplex. Thus, per line a quasi doubling and hence also a considerable improvement in resolution is obtained.

This improvement can be attained by the specific configuration of the common electrodes. Also in embodiments with other electrode configurations, in which, for example, in the column direction the common electrodes are constituted by straight strips defining in the subjacent charge transport channels columns of charge storage sites, a high resolution is often desirable. In the device described above having relatively offset electrodes, it may also be of importance to increase the resolution to an even higher level.

SUMMARY OF THE INVENTION

The invention has inter alia for its object to provide an image sensor device of the line transfer type, by means of which a high resolution can be obtained and which yields a high degree of flexibility with respect to the electrode configuration.

The invention is based inter alia on the recognition of the fact that the electrodes of the first phase can be used not only as a selection gate during reading, but also as a photo gate by which in the semiconductor body a potential well can be induced in which generated charge can be stored in the form of a charge packet.

According to the invention, an image sensor of the kind described in the opening paragraph is characterized in that means are provided for applying different voltages to the electrodes of the first phase of the charge-coupled devices during recording of the radiation image in such a manner that at one voltage the said electrodes act as separation electrodes, in the semiconductor regions below these electrodes potential barriers being formed, which separate adjacent pixels from each other, and that at the other voltage the said electrodes act as a photo gate, the semiconductor regions located below these electrodes each belonging to a given pixel and two adjacent pixels in one line being separated from each other by a potential barrier formed in semiconductor regions below common electrodes.

In an image sensor according to the invention, the distribution of the pixels in a line can take place by purely electronic means, as a result of which with a high resolution nevertheless a large choice of possibilities is offered both in electrode configuration and in mode of operation.

BRIEF DESCRIPTION OF THE DRAWING

The invention will now be described more fully with reference to a few embodiments, by way of example, and the accompanying diagrammatic drawing, in which.

DESCRIPTION OF THE PREFERRED EMBODIMENTS

Figure 1:
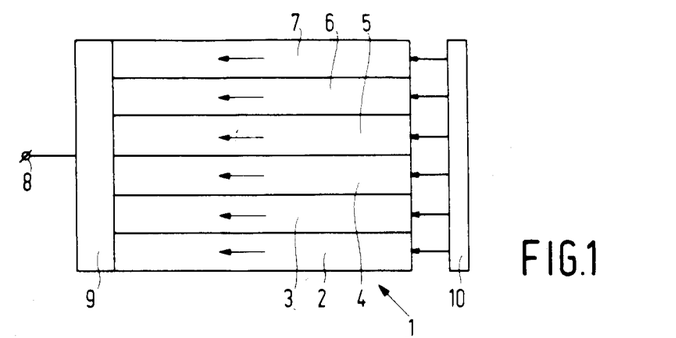
FIG. 1 shows a block circuit diagram of an image sensor arrangement of the line transfer type.

FIG. 1 shows a block circuit diagram of a charge-coupled image sensor 1 of the line transfer type. The arrangement comprises a number of adjacent parallel charge-coupled devices, which can be a few hundreds up to even more than a thousand in number, but of which the drawing shows only six, i.e. the devices to 2-7. The charge-coupled devices each constitute a line of photosensitive elements or pixels which are read sequentially at the output 8 of reading means 9. As will be explained hereinafter with reference to the description of a particular embodiment, the reading means can comprise a vertical charge-coupled line, whose transport direction is at right angles to the transport direction in the channel 2-7. The arrangement further comprises selection means 10, with the aid of which the line or register 2-7 to be read can be selected.

The arrangement of the type described here is distinguished from the better known charge-coupled image sensors of the frame transfer type and the interline type in that, as compared with these better known types, a smaller amount of space is required due to the fact that no additional storage space is necessary.

Figure 2:
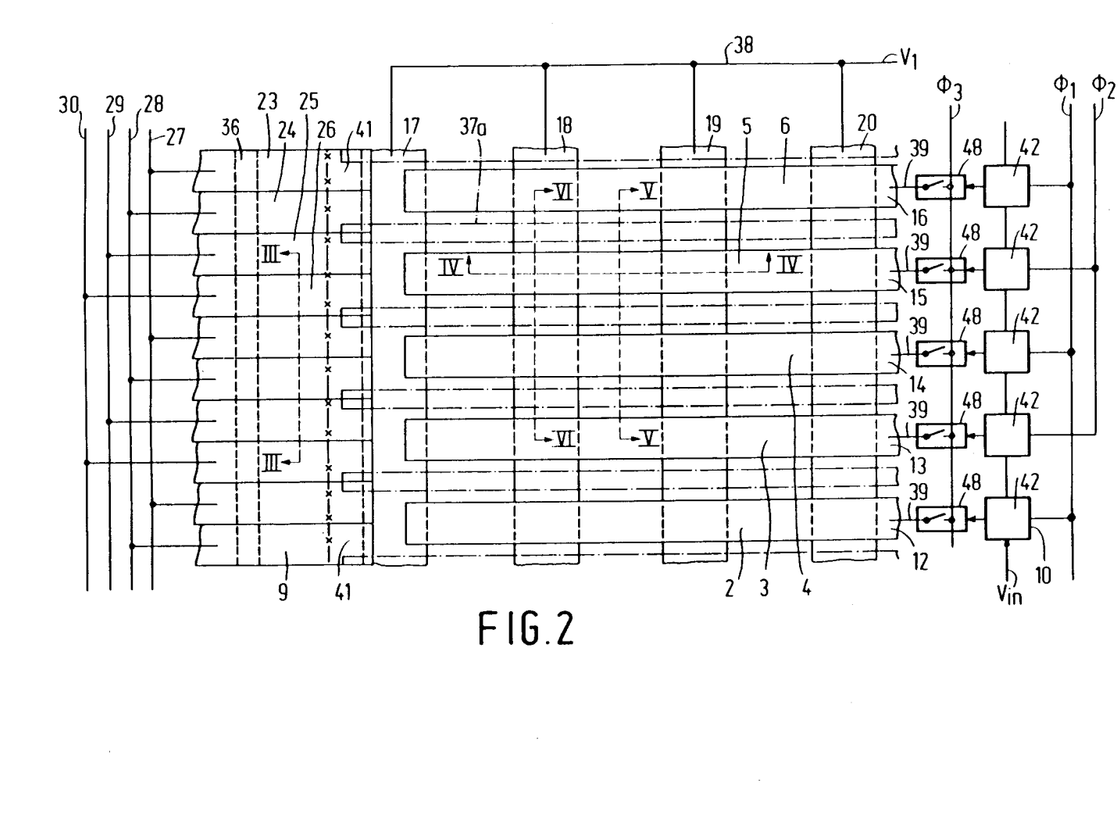
FIG. 2 is a plan view of a part of an image sensor arrangement of the line transfer type in accordance with the invention.
Figure 3:
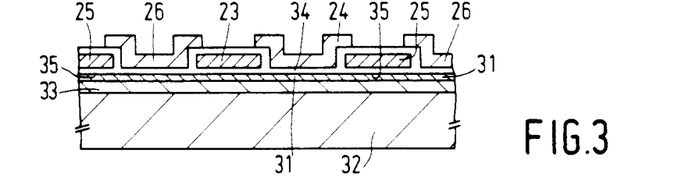
FIG. 3 is a sectional view of this arrangement taken on the line III—III in FIG. 2.

FIG. 2 is a diagrammatic plan view of a line transfer sensor according to the invention. Sectional views of this arrangement are shown in FIGS. 3 to 6.

In FIG. 2, the represented horizontal CCD registers forming the photosensitive matrix are again designated by reference numerals 2 to 6. These registers are constructed in this case as two-phase charge-coupled devices, but it will be appreciated that three-phase, four-phase or other multiphase charge-coupled devices may also be used. The charge-coupled devices are provided with an electrode system comprising electrodes belonging alternately to one of the two phases. The electrodes of one phase, designated by reference numerals 12-16, can be selectively controlled for each of the charge-coupled devices 2-6 and in the present embodiment they are constituted by elongate strip-shaped conductors, which each extend above and parallel to the associated channel of the charge-coupled device. The clock electrodes of the other (second) phase, of which only four are shown in FIG. 2, which are denoted by reference numerals 17-20, are common to all CCD lines 2-6 and are each constituted by a strip-shaped conductor extending transversely to the charge transport direction in the CCD's 2-6. The electrodes 17-20 are interconnected by the connection 38 indicated only diagrammatically.

The reading means 9 in the present embodiment comprise a conventional four-phase vertical CCD register, of which the clock electrodes 23-26 are alternately connnected to the clock lines 27-30.

As appears from the sectional views shown in FIGS. 3-6, the charge-coupled devices 2-6 and 9 are of the buried channel type, but it will be appreciated that charge-coupled devices of the surface type or of the bucket brigade type may also be used. The charge-coupled devices are, by way of example, of the n-channel type and each comprise an n-type surface zone 33, which is formed in the p-type silicon body 32 and constitutes the charge transport channel of the charge-coupled device. The charge transport channels 33 are separated from the overlying electrodes by a thin insulating layer 34 of, for example, silicon oxide, which is provided on the surface 35.

The charge transport channel 33 of the output register 9 is laterally bounded on the lefthand side (FIG. 2) by a p-type channel-limiting zone 36 indicated by broken lines in FIG. 2. On the righthand side, the channel of the charge-coupled device is bounded by an n-type region 41 located between the clock electrode 17 and the dot-and-cross line of FIG. 2. The clock electrodes 23-26 overlap the region 41, as a result of which, when clock voltages are applied to these electrodes, potential barriers are induced in the region 41 which limit the charge to the vertical channel 9. A difference in doping between the channel 9 and the region 41 is obtained by providing in the channel 9 an additional n-doping 31 (see FIG. 3). As appears from FIG. 3, a two-layer overlapping electrode configuration can be used for the electrodes 23-26.

The channels 33 of the charge-coupled devices 2-6 are separated from each other by channel-limiting zones 37, of which the parts 37a (indicated in FIG. 2 by dot-and-dash lines) extend as far as below the electrodes 23-26 of the vertical reading register 9. The p-type channel-limiting zones 37b are mainly located in the parts of the matrix which are not covered by electrodes.

The n-channels 33 and the intermediate p-type channel-limiting zones 37 can be obtained by first forming a coherent n-type region in the p-type substrate 32 and then forming from this coherent n-type region in the n-channels 33 by means of the p-type zones 37a. After the electrode configuration 12-20 has been provided, the p-type channel limiters 37b can be formed in the parts of the photosensitive matrix not covered by electrode material.

The common electrodes 17,18,19,20 are connected to a conductor 38, to which the voltage $V_1$ can be applied. The separate clock electrodes 12-16 are each connected through a conductor 39 to the selection member 10. The electrodes 12-20 form a two-phase system on behalf of which means are provided below each of these electrodes determining a charge transport direction when voltages are applied. In the embodiment described here (see FIG. 4), the doping concentration is increased in the n-type regions 40 below the electrodes 12-20. When voltages are applied, there are generated at the area of the zones 40 potential wells which act as charge storage regions and are each bounded on the righthand side by a potential barrier in the less highly doped regions between the zones 40, which only act as transfer regions. The zones 40 define the charge transport from the righthand side to the lefthand side. The zones 40 can be provided simultaneously with the zone 31 in the vertical register 9. Of course the two-phase action can also be obtained in a different manner known per se, such as by providing thinner oxide above the transfer regions or by a p-implantation in the transfer regions.

The clock electrodes 12-16 are biased by means of the selection member 10, which in the present embodiment comprises a shift register which is indicated diagrammatically in FIG. 2 by the blocks 42. Via the lowermost block 42, an input signal $V_{in}$ is supplied, which can be shifted to the next subsequent stages by means of the clock voltages $\phi_1$ and $\phi_2$. The shift register in turn controls the switches 48, which, if closed, connect the clock electrodes 12-16 to the clock voltage source $\phi_3$.

Figure 7:
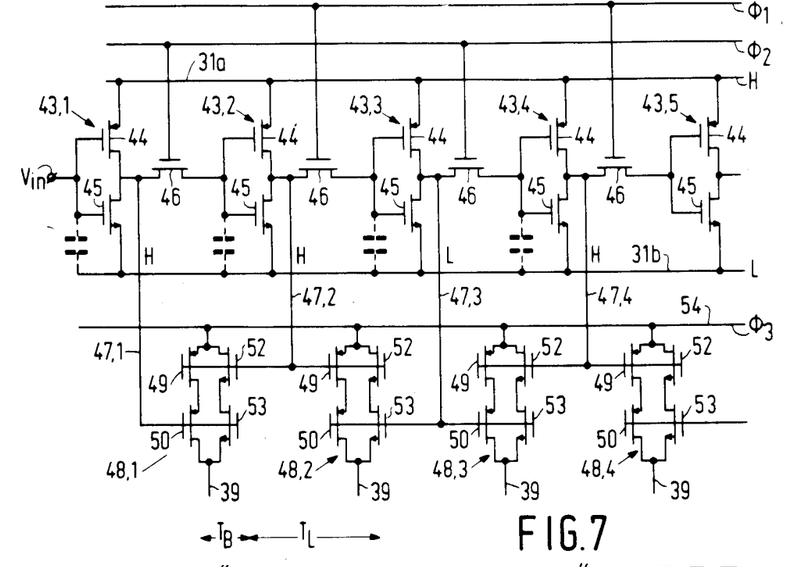
FIG. 7 shows the circuit diagram of a shift register used in the arrangement shown in FIG. 2.

FIG. 7 shows a circuit diagram of (a part of) a possible embodiment of the shift register 10. The circuit comprises a series of CMOS inverter circuits 43,1, 43,2, 43,3 each having a p-channel MOST 44 and an n-channel MOST 45. The inverter circuits are interconnected by the n-MOST switches 46, which are alternately driven by the clock voltages $\phi_1$ and $\phi_2$ already shown in FIG. 2. The inverter circuits 43 are fed through two supply lines 31a,31b, to which a high voltage H and a low voltage L, respectively, are applied and which are connected to the source zones on the p-MOS transistors 44 and the n-MOS transistors 45, respectively.

The outputs of the CMOS inverter circuits 43 are connected by means of conductors 47 to the inputs of modulo two switches 48,1, 48,2, 48,3 etc. Modulo two switches are switches which are closed when the input signals are equal and which are opened when the input signals are unequal. In the present embodiments, each switch 48 comprises two series-connected p-MOS transistors 49 and 50 (or one dual gate MOST) and parallel thereto two n-MOS transistors 52 and 53 which are also connected in series (or one dual gate MOST). The transistors 49 and 52 are connected to a clock line 54, to which a clock voltage $\phi_3$ is applied, which, depending upon the input signals, may be transmitted by the switches 48. The transistors 50 and 53 are connected to a conductor 39, through which the clock voltage $\phi_3$ can be transmitted to the clock electrodes 2-6. The connections 47,1, 47,3 etc. are connected, as appears from FIG. 7, to the gate electrodes of the transistors 50 and 53, while the connections 47,2, 47,4 etc. are connected to the gate electrodes of the transistors 49 and 52.

The arrangement described here can be manufactured by means of generally known techniques, while the shift register shown in FIG. 7 may be integrated, according to desire, together with the charge-coupled sensor in the same semiconductor body. Of course also other types of circuits having comparable functions, for example circuits only comprising n-channel transistors, may also be used for the blocks 43 and 48.

Figure 8:
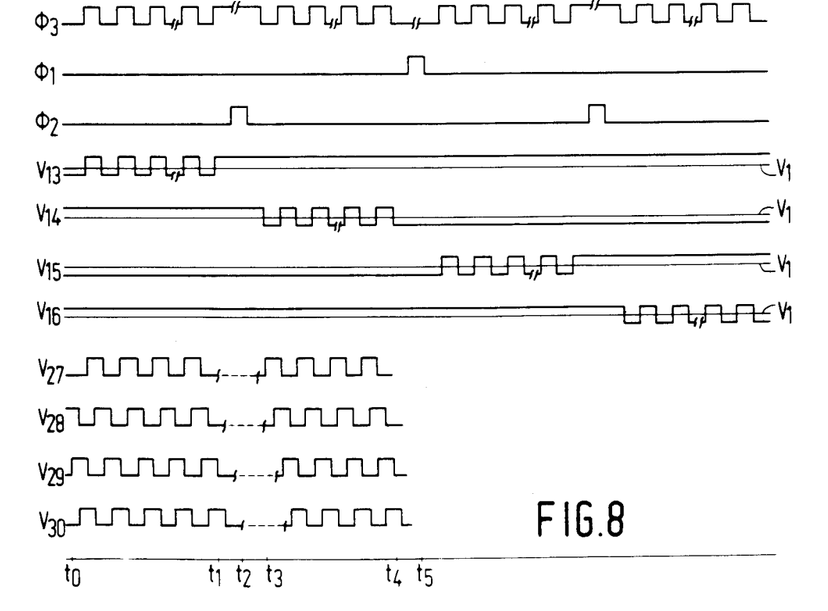
FIG. 8 shows the diagram of voltages to be applied to the arrangement shown in FIG. 2.

For explanation of the operation of the arrangement described here, FIG. 8 shows a circuit diagram of clock voltages to be applied as a function of the time t. Moreover, the Figure shows the time intervals $T_L$ and $T_B$, which represent the line period and the line fly-back period, respectively. As a reference level the voltage $V_1$ is chosen, which (cf. FIG. 2) is applied to the common clock electrodes 17-20. The clock voltages $V_{12}$-$V_{16}$, which are applied to the respective clock electrodes 12-16, are located above or below the level of $V_1$. When $V_{12}$-$V_{16}$ is higher than $V_1$, the regions in the associated channel below the relevant electrodes 12-16 form a charge storage region, while the regions below the electrodes 17-20 in this register form a potential barrier. When on the contrary a potential of the associated electrode 12-16 in a given horizontal register is lower than $V_1$, the regions below this electrode form potential barriers, while the regions below the electrodes 17-20 form charge storage regions.

In order to explain the operation, there is first considered the situation shown in FIG. 7, in which the signals H, H, L, H are applied to the respective conductors 47,1 ... 47,4. In this situation, only the switch 48,1 is closed. The remaining switches 48,2, 48,3 etc. are open. If it is assumed that the switches 48,1 ... 48,4 are connected through the conductors 39 to the clock electrodes 13, 14, 15 and 16, respectively, the clock voltage $\phi_3$ will be applied via the switch 48,1 only to the electrode 13.

In the line period $T_2$ between $t_0$ and $t_1$ the information present in the charge-coupled device 3, of which the clock electrode 13 forms part, will be transported to the vertical charge-coupled device 9. In the usual four-phase manner, the charge packets are transported by the application of the four-phase clock voltages $V_{27}$-$V_{30}$ via the device 9 to a detection element, in which they can be read sequentially.

As appears from FIG. 8, the clock electrode 12 was at the low level with respect to $V_1$ before the charge was shifted so that the integration of the generated charge was effected in charge storage sites below the electrodes 17-20. Whilst reading the line 3, radiation is absorbed in all the remaining lines 4-6 (charge-coupled devices) and integrated in the form of electrical charge. In this period, the electrode 14 is at the high level so that in the line 14 the charge is integrated in potential wells below the electrode 14. On the contrary, the clock electrode 15 is at the low level so that in the line 5 the charge is integrated below the common electrodes 17-20. In the line 6 the charge is again integrated below the clock electrode 16. In each pair of adjacent lines the pixels are therefore shifted by a half pitch with respect to each other (at least with the same field or frame). This is shown diagrammatically in FIG. 9. This Figure shows diagrammatically a part of the photosensitive matrix with a number of lines 3,4,5,6 etc., the crosses representing the centres of the pixels during a first frame. In the lines 3,5 . . . , the pixels are shifted by a half pitch with respect to the pixels in the lines 2,4,6 etc.

After termination of the line period when the line 3 is entirely empty and the line flyback period $T_B$ begins (instant $t_1$ in FIG. 8), $\phi_3$ remains at the high level. The clock $\phi_2$ reaches the high level, as a result of which the signal H at the connection 47,1 is transferred to the input of the inverter circuit 43,2. The low signal L then appears at the output of the inverter circuit 43,2. Due to the fact that the high signal H is at the connection 47,1 and the low signal L is at the connection 47,2, different input signals are transferred to the switch 48,1. The switch 48,1 is therefore opened, as a result of which the connection between the clock electrode 13 and the clock $\phi_3$ is interrupted. Since at the instant of the interruption $\phi_3$, was at the high level, the clock electrode 13 remains at the high level. The charge-coupled device 3 is now ready again for recording an image for a next frame, the generated charge being integrated in potential wells below the electrode 13. The pixels of the line 3, whose centres are now indicated in FIG. 9 by black dots, are shifted by a half pitch with respect to the pixels in the first frame (crosses).

Figure 9:
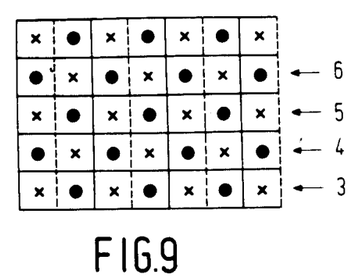
FIG. 9 shows diagrammatically the pixel distribution in the arrangement shown in FIG. 2 with the clock voltages shown in FIG. 8.

Due to the fact that the low signal L is at the output of the inverter circuit 43,2 and the output signal of the inverter circuit 43,3 has not changed, but is likewise L, equal input signals are supplied to the switch 48,2 via the connections 47,2 and 47,3. The switch 48,2 is therefore closed and connects the clock $\phi_3$ via the conductor 39 to the clock electrode 14. In the preceding integration period (cf. FIG. 8), this electrode was at a high voltage level (above $V_1$) and therefore acted as an integration gate below which the generated charge was integrated. The centres of the pixels, indicated again by crosses in FIG. 9, are shifted by a half pitch with respect to the centres of the pixels in the same frame in the line 3.

At $t_3$ the line flyback period is terminated and $\phi_3$ starts to clock again at the next line period $T_L$. In a known two-phase manner, the charge packets stored in the line 4 are shifted in the charge-coupled device (line 4) to the left in the vertical register 9 and are shifted in the usual four-phase manner in the register 9 to a reading member. At the instant $t_4$, the line (charge-coupled device) 4 is entirely empty. At this instant, the clock $\phi_3$ stops at the low voltage level. At $t_5$, $\phi_1$ is high, as a result of which the low signal L at the output of the inverter circuit 43,2 is transferred to the input of the next stage, i.e. the inverter circuit 43,3. The low input signal is inverted by the stage 43,3, as a result of which the high signal H is transmitted via the conductor 47,3 to the switch 48,2. Via the conductor 47,2, the low signal L is continuously transmitted to the switch 48,2. The switch 48,2 is then opened, as a result of which the connection between $\phi_3$ and the clock electrode 14 is interrupted. In the line 4, which is again ready for the formation of new charge packets, the generated charge carriers are integrated below the electrodes 17-20. In FIG. 9, this is indicated again by the black dots in line 4. These dots are shifted by a half pitch with respect to the centres of the pixels in the line 4 during the first frame, which is also the case with respect to the centres of the pixels in the second frame in the preceding line 3.

In an analogous manner, the remaining lines 5,6 etc. of the matrix can also be read for the first frame, after which the second frame can be integrated in the shifted pixels. When the last (uppermost) line has been read, the second frame can be read in an analogous manner after the frame fly-back period. It should be noted that, when the horizontal electrodes 13,14,15 etc. are given different voltage levels during the integration period, an increase of the pixel density and hence also an increase of the resolution can be obtained in a simple manner.

In the image sensor described here, each line is read separately. It may also be advantageous when each time two adjacent lines are read in time division multiplex, as is described already in the U.S. Pat. No. 4,242,700 already mentioned in the preamble.

Figure 10:
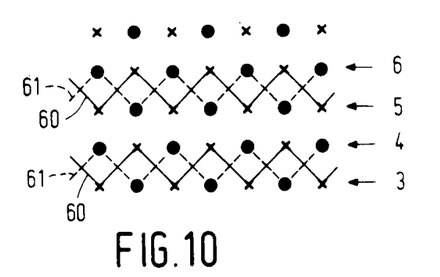
FIG. 10 shows diagrammatically the pixel distribution in the arrangement shown in FIG. 2 in another mode of operation.

A possible embodiment of this mode of operation is shown diagrammatically in FIG. 10. In this Figure, in the same manner as in FIG. 9, the distibution of the pixels in the charge-coupled devices 3,4,5,6 etc. during two successive frames is indicated by crosses and dots, respectively. When reading the first frame, for example the lines 3 and 4 are read together in time division multiplex, after which in the same manner the lines 5 and 6 are read, etc. In FIG. 10, this is indicated diagrammatically by the full lines 60. When the first frame has been read entirely, the second frame is read, the CCD 1 being read together with the CCD 2, then CCD 3 and CCD 4 being read together, subsequently 5+6, etc. This is indicated diagrammatically in FIG. 10 by the broken lines 61 interconnecting the dots.

For the description of the operation of the sensor, the starting member is the arrangement as described with reference to FIGS. 2-6, whilst it has to be taken into account that, as compared with the horizontal CCD's 2,3 etc., the vertical register 9 should be operated at double the clock frequency. The shift register 10, by which the horizontal CCD's are selected, can be composed of two registers of the kind shown in FIG. 7, the separate electrode of a first horizontal CCD being connected to the first shift register and the separate electrode of the next horizontal CCD being connected to the second shift register.

Figure 11:
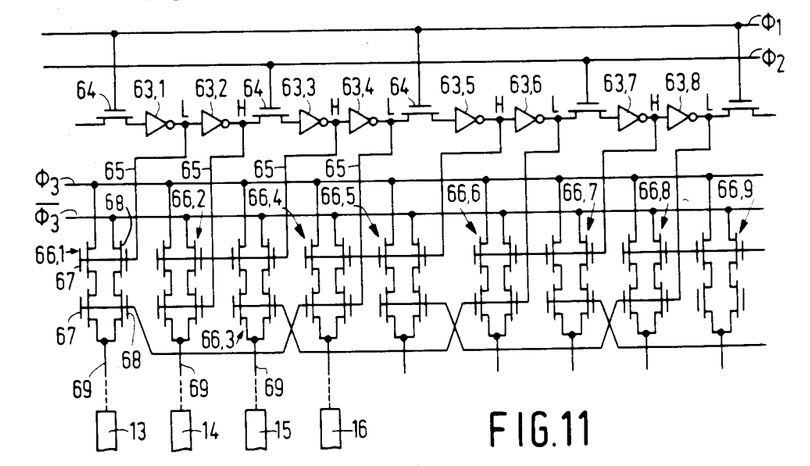
FIG. 11 shows the circuit diagram of a shift register which can be used for this mode of operation.

A simpler embodiment occupying a smaller amount of space is shown in FIG. 11. The arrangement again comprises a chain of inverter circuits 63,1, 63,2, 63,3, which are shown in the drawing in block diagrammatic format, but which, if desired, may have the same construction as the C-MOS inverter circuits 43 in FIG. 7. Between each pair of inverter circuits 63 there is arranged a switch, for example in the form of a MOS transistor 64, by which output signals can be transferred in a controllable manner from one inverter circuit to a next inverter circuit. The gates of the switch 64 are connected to clock lines, through which the clock voltages $\phi_1$ and $\phi_2$ are supplied. The outputs of the inverter circuits 63 are connected via connections 65 to modulo two switches 66,1, 66,2, 66,3 etc. The construction of the modulo two switches 66 (exclusive NOR) may be similar to that of the switches 48 in FIG. 7. Each switch again comprises a lefthand branch of, for example, p-MOS transistors 67 and a righthand branch of n-MOS transistors 68. The lowermost transistors 67,68 of each circuit 66 are again connected through an output 69 to the separately controllable clock electrodes 12,13,14 etc. of the horizontal CCD lines 2, 3, 4 etc. The uppermost transistors 67,68 are now no longer connected together to a clock line, as in the preceding embodiment. The p-MOS transistors are now connected to a clock line $\phi_3$ and the n-MOS transistors 68 are connected to the clock line $\bar{\phi}_3$, $\bar{\phi}_3$ representing the complementary clock of $\phi_3$.

The output of the inverter circuit 63,1 is connected to the uppermost transistors of the switch 66,1, of which the lowermost transistors 67,68 are connected together with the lowermost transistors 67,68 of the switch 66,4 to the output of the inverter 63,4. The output of the inverter 63,2 is connected to the lowermost transistors 67,68 of the switch 66,2, of which the uppermost transistors are connected together with the uppermost transistors of the switch 66,3 to the output of the inverter 63,3. The lowermost transistors of the switch 66,3 are connected together with the lowermost transistors of the switch 66,6 to the output of the inverter circuit 63,6. The uppermost transistors of the switch 66,4 are connected to the output of the inverter 63,5 together with the uppermost transistors of the switch 66,5, etc.

For the sake of simplicity, it is assumed again that the switch 66,1 is connected to the clock electrode 13 of the CCD 3, the switch 66,2 is connected to the clock electrode 14 of the CCD 4, the switch 66,3 is connected to the clock electrode 15 of the CCD 5, etc.

Figure 11A:
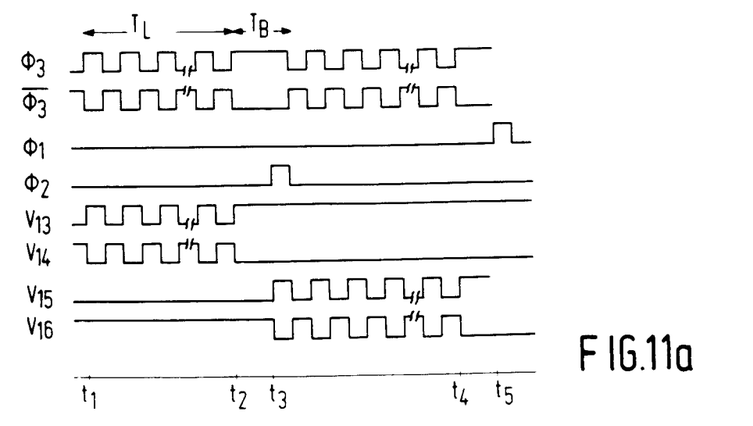
FIG. 11a shows the voltages applied in this mode of operation as a function of the time t.

For the description there is first considered the situation shown in FIG. 11, in which the outputs of the inverters 63,1, 63,2, 63,3 etc. have the respective levels L, H, H, L, H, L, H, L . . . . In FIG. 11a, the voltages $\phi_3$, $\bar{\phi}_3$, $\phi_1$, $\phi_2$ and $V_{13}-V_{16}$ are plotted for a given time interval as a function of the time t. In the time interval $t_1-t_2$, the switch 66,1, of which the two input signals are L (low), is closed via the p-MOS transistors 67 in the lefthand branch, while the righthand branch of n-MOS transistors is opened. Via the switch 66,1, the clock voltage $\phi_3$ is transmitted to the clock electrode 13.

At the same time, the switch 66,2, of which both input signals are H (high), is closed via the n-MOS transistors in the righthand branch and is opened in the lefthand branch of p-MOS transistors. Via the switch 66,2, the clock voltage $\bar{\phi}_3$, which is in phase opposition to $\phi_3$, is applied to the clock electrode 14.

The charge packets stored in the charge-coupled devices 3 and 4 represented by the crosses in FIG. 10 are transported by the CCD's 3 and 4 to the charge-coupled device 9, the transport in one channel being shifted by 180° with respect to the transport in the other channel. The charge packets arrive in the channel in time division multiplex and can be transported there, by operating the channel 9 at double the frequency and in the correct phase with respect to the channels 3 and 4, in time division multiplex to a reading member and can be derived there for further processing.

When the lines 3 and 4 are entirely empty, $\phi_3$ remains at the high level and $\bar{\phi}_3$ remains at the low level during the line fly-back period. At the instant $t_3$, $\phi_2$ produces a pulse, as a result of which the outputs of the inverters 63,3 and 63,4 change and pass to L and H, respectively. Consequently, the switches 66,1 and 66,2 are opened, as a result of which the connection between the electrodes 13 and 14 and the clock lines $\phi_3$ and $\bar{\phi}_3$ is interrupted and these electrodes remain at the high and the low level, respectively. In the charge-coupled devices 3 and 4, charge corresponding to the radiation image to be recorded can now be integrated again to charge packets. In FIG. 10, these packets are indicated by dots and are shifted by a half pitch with respect to the charge packets just read.

At the same time, the switches 66,3 and 66,4 are closed. The switch 66,3, whose two inputs are L, is closed via the p-transistors in the lefthand branch and connects $\phi_3$ to the clock electrode 15 of the CCD 5. The switch 66,4, of which both input signals are H, is closed via the n-transistors in the righthand branch and connects the clock electrode 16 of the CCD 6 to $\bar{\phi}_3$. The clocks $\phi_3$ and $\bar{\phi}_3$ are now supplied to the clock electrodes 15 and 16. The CCD lines 5 and 6 are now read in time division multiplex, that is to say (crosses in FIG. 10) in the same manner as the CCD lines 3 and 4.

When the lines 5 and 6 are empty and the line period terminates ($t_4$ in FIG. 11a), the clocks $\phi_3$ and $\bar{\phi}_3$ remain at the high and the low level, respectively. By the $\phi_1$ pulse at $t_5$, the connections between $\phi_3$ and $\bar{\phi}_3$ and the clock electrodes 15 and 16 are interrupted in the same manner as described above for the switches 66,1 and 66,2. The electrodes 15 and 16 now remain at the high and the low voltage level, respectively. During the following integration period, charge packets can be generated in the line 5 below the electrode 15. On the contrary, charge packets are generated in the CCD line 6 below the electrodes 17-20, i.e. shifted by half a pixel with respect to the CCD line 5. In FIG. 10, these charge packets (or centres of the pixels) during this second frame period are indicated by black dots.

Thus, the whole matrix of pixels can be read in time division multiplex. When the first frame has been read entirely, the second frame can be read by again reading in the same manner as described above the line 1,2, then 3 and 4, subsequently 5 and 6 etc.

In this manner, the image can be read in time division multiplex with a high resolution in horizontal direction.

Figure 12:
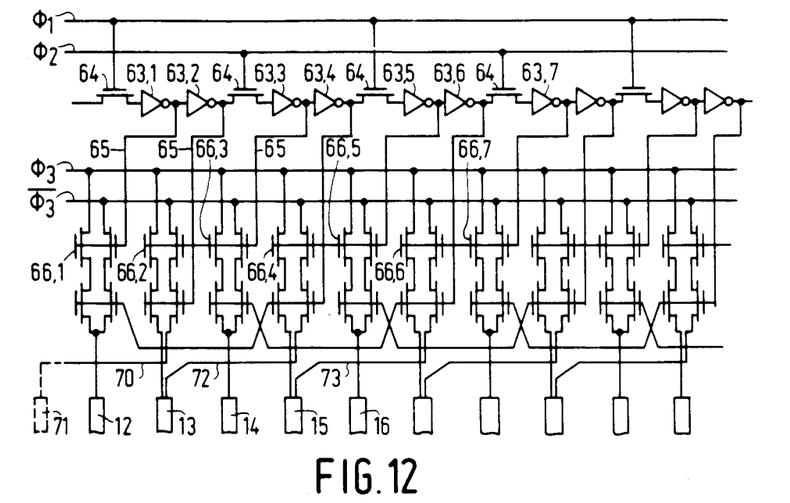
FIG. 12 shows the circuit diagram of a shift register which can be used for a line-interlaced (interline) mode of operation of the arrangement shown in FIG. 2.

By means of the shift register shown in FIG. 11, each time two equal lines can be read in time division multiplex. Most of the solid state image sensors of the frame transfer type are operated in the so-called line-interlaced mode. FIG. 12 shows a shift register, by which also each time two adjacent lines are read in time division multiplex, but in which the line combinations for two successive frames are different. The register again comprises a chain of alternately inverter circuits 63 and MOS switches 64 analogous to the chain of inverter circuits in the preceding embodiment. The outputs of the inverters 63 are connected in the same manner as in FIG. 11 to the modulo two switches (exclusive NOR circuits) 66, which are again assumed to be each composed of a lefthand branch of p-channel MOS transistors and a righthand branch of n-channel MOS transistors. Via these switches, the clock $\phi_3$ and the clock voltage $\bar{\phi}_3$ complementary thereto are supplied to the clock electrodes 12-16 (shown diagrammatically in FIG. 12) of the charge-coupled devices 2-6 shown in FIG. 2. The switches 66,1, 66,3, 66,5 etc. are connected in the manner described above to the associated clock electrodes 12, 14, 16 etc. The p-MOST branches of the switches 66,2, 66,4, 66,6 etc. are connected to the clock electrodes 13, 15 . . . . The n-MOST branches of the swithces 66,2, 66,4, 66,6 etc. are connected to the clock electrodes which are each time two numbers lower. For example, the n MOST's of the switches 66,4 are connected to the clock electrode 13, while those of the switch 66,6 are connected to the clock electrode 15, etc.

TABLE

| | 63.1 | 63.2 | 63.3 | 63.4 | 63.5 | 63.6 | 63.7 | $\phi_3$ | $\bar{\phi}_3$ |
|---|---|---|---|---|---|---|---|---|---|
| $t_1$ | 0 | 1 | 1 | 0 | 1 | 0 | 1 | 12 | 71 |
| $t_2$ | 0 | 1 | 0 | 1 | 1 | 0 | 1 | 14 | 13 |
| $t_3$ | 1 | 0 | 0 | 1 | 0 | 1 | 0 | 13 | 12 |
| $t_4$ | 1 | 0 | 1 | 0 | 0 | 1 | 0 | 15 | 14 |

For explanation of the operation of the shift register shown in FIG. 12, the Table indicates the state of the inverter circuits 63,1-63,7 at a number of instants; the last two columns indicate, which clock electrodes of the charge-coupled devices 2-6 are clocked in any state by $\phi_3$ and $\bar{\phi}_3$. The symbol "0" indicates the low voltage level, while the symbol "1" indicates the high voltage level.

At $t_1$, the input signals of the switch 66,1 are both low ("0" in the Table). In this state, the switch 66,1 is closed via the p-MOST's, as a result of which $\phi_3$ is supplied to the clock electrode 12. The input signals of the switch 66,2 are both high so that the switch 66,2 is closed via the n-transistors and transmits the voltage $\bar{\phi}_3$. N-channel transistors of 66,2 can be connected through the connection 70 to the clock electrode 71 (indicated by broken lines in FIG. 12) of a CCD line before the lowermost line 2, which is shown in FIG. 2. In this situation, this line and the line 2 can then be read in time division mulitplex.

In the case which the CCD line 2 forms the first line of the matrix, the connection 70 can lead to the selection gate of the last CCD, or can be omitted in another embodiment, in which, for example, the selection gate of the last CCD is connected to a switch 66,2n. The information appearing in this situation at the output of the vertical register is then not used.

When at least the register 2 is empty, during the following line fly-back period a $\phi_2$ pulse is produced. The state which then occurs is indicated in the Table at $t_2$. The clock electrode 13 is then connected via the connection 72 and the switch 66,4 to $\bar{\phi}_3$ and the clock electrode 14 is connected via the switch 66,3 to $\phi_3$. In an analogous manner, the electrodes 15,16 etc. can be read in time division multiplex. When the whole frame has been read, the second frame is read.

The Table indicates a first state of the shift register during the second frame at $t_3$, two successive inverters both exhibiting a "0". The clock electrode 12 is now connected to $\bar{\phi}_3$ via the switch 66,1 (both input signals high). The clock electrode 13 is connected via the switch 66,2 (both input signals low) to $\phi_3$. Consequently, the CCD lines 2 and 3 are now read in time division multiplex. When during the next line fly-back period a $\phi_2$ pulse is supplied to the shift register, the state at $t_4$ (Table) is attained. The clock electrode 14 is then connected via the switch 66,3 (high input signals) to $\bar{\phi}_3$. The switch 66,4 (low input signals) connects the clock electrode 15 to $\phi_3$. In this situation, the CCD lines 4 and 5 are read in time division multiplex. Thus, the whole matrix can be read again.

Figure 13:
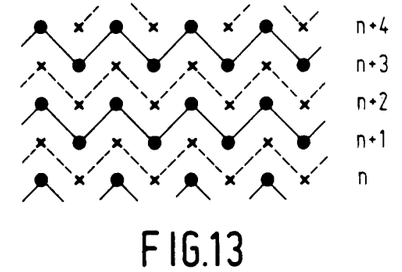
FIG. 13 shows diagrammatically the pixel distribution in the arrangement shown in FIG. 2 for this line-interlaced mode of operation.

FIG. 13 shows diagrammatically the two read frames in the same manner as FIGS. 9 and 10. In FIG. 13, a number of CCD lines n to n+4 are indicated symbolically by crosses and dots representing the centres of the pixels during the two frames. In the first frame (crosses), for example, first the CCD lines are read in time division multiplex in the combinations (n, n+1), (n+2, n+3), (n+4, n+5), each time indicated in the Figures by the broken lines between the crosses. In the other frame (dots), the CCD lines are read in time division multiplex in the combinations (n+1, n+2), (n+3, n+4), etc.

In the embodiment described with reference to FIG. 2, the common electrodes 17,18,19 etc. are applied to a fixed voltage $V_1$, while via the shift register 10 alternating voltages at levels above and below $V_1$ are applied to the separate electrodes 12-16. In a variation of this embodiment, the alternating voltage can be applied to the common electrodes 17-20, while a high voltage H' and a low voltage L', respectively, are applied to the non-selected electrodes 12-16, these latter voltages having levels corresponding, for example, to or being higher and lower, respectively, than the high and low level, respectively, of the clock voltage. A fixed voltage having a level M lying between the levels of the clock voltage can be applied to the selected electrodes 12-16 of the line which is read.

Figure 14:
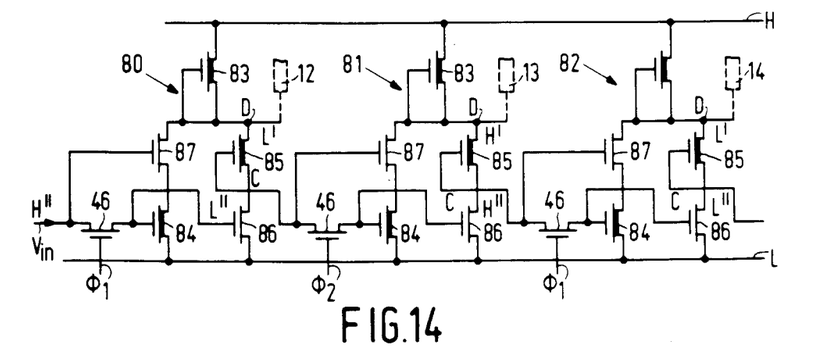
FIG. 14 shows the circuit diagram of another shift register which can be used in a charge-coupled image sensor in accordance with the invention.

FIG. 14 shows the circuit diagram of a possible embodiment of a shift register to be used in this case. The drawing shows only three stages 80,81,82, which are interconnected by the switches 46. The gates of the switches are again driven by the clocks $\phi_1$ and $\phi_2$. The input signal $V_{in}$ is supplied via the extreme lefthand MOST 46.

The stages 80,81,82 etc. are switched between two voltage levels H and L. Each stage is composed of five transistors, which are all of the n-channel MOST type. The transistors 83,84,85, whose channel region is indicated by a fat line, are of the depletion type, i.e. of a type in which current can also flow when the gate-source voltage $V_{gs}=0$ V. The transistors 86 and 87 are of the enhancement type and are therefore not current-conducting at $V_{gs}=0$ V.

The transistors 84 and 87 are connected in series, while the source of the transistor 84 is connected to the line L, the drain of the transistor 84 is connected to the source of the transistor 87 and the drain of the transistor 87 is connected via the transistor 83 connected as a load to the line H. In the same manner, the source of the transistor 86 is connected to the line L, the drain of the transistor 86 is connected to the source of the transistor 85 and the drain of the transistor 85 is connected also through the transistor 83 to the line H'.

The gates of the transistors 84 and 86 are both connected to the output side of the switch 46. The gate of the transistor 87 is connected to the input side of the switch 46. The gates of the transistors 83 and 85 are each connected to their sources so that these transistors are always conducting.

The junction C between the drain of the transistor 86 and the source of the transistor 85 is connected to the input side of the switch 46 between the corresponding stage and the next subsequent stage. The junctions D between the drains of the transistors 85 and 87 on the one hand and the source of the transistor 83 on the other hand constitute the outputs of the shift register. These outputs are each connected to one of the electrodes 12-16. For illustration, in FIG. 14 the electrodes 12, 13 and 14 are indicated by broken lines, by way of example.

For explanation of the operation of the shift register shown in FIG. 14, there is first considered the situation shown in the drawing, in which the input signal $V_{in}=H''$ is supplied to the input of the stage 80. In this connection it should be noted that the signals L' and H', which are derived from the levels L and H, are signals which appear at the outputs D of the stages, where L' can be slightly higher than L and H' can be practically equal to H. The signals L'' and H'' are levels which appear at the outputs C, where L'' can again be slightly higher than L and H'' can be equal to H.

In the situation in which $V_{in}=H''$ and this signal is transmitted to the first stage via the switch 64, both the series arrangement 87,84 and the series arrangement 85,86 of the first stage are conducting. The output signals at D and C are L' and L'', respectively. The signal L'0 is transmitted to the electrode 12 so that this electrode acts in the associated charge-coupled device as a blocking gate. The signal L'' at the output C of the first stage can be transmitted via the second switch 46 to the second stage 81. The transistors 87 and 86 of this stage are non-conducting so that the signals H'' (=H) and H' (=H) appear at the outputs C and D, respectively. The electrode 13, to which the voltage H is supplied, acts as an integration gate.

The signal H'' again constitutes an input signal for the stage 82. The outputs C and D of this stage produce the output signals L'' and L', respectively, so that the gate electrode 14, which is connected to the output D of the stage 82, acts as a blocking gate.

The electrodes 12,13, 14 etc. of the image sensor are therefore alternately at a low and a high voltage level, which means that the pixels in the adjacent lines are shifted by a half pitch with respect to each other. It should be noted that the electrodes 12,13,14 etc. are at an accurately defined nonfloating potential during the integration period, which is in contrast with the preceding embodiments, in which the electrodes float during the integration.

In order to read after the integration period for example the line 2, the input signal $V_{in}=L''$ is supplied whilst $\phi_1$ is low and the switch 46 is consequently non-conducting. The transistor 87 and hence the series arrangement 87–84 now becomes non-conducting. The transistors 85–86 of the stage 80 remain conducting, however. The point C therefore remains low (so that nothing changes in the stage 81), but the potential of the point D increases to a level M between H and L. The level of M can be adjusted by means of the choice of the geometry of the transistors 83 and 85. The relevant line 2 can then be read.

When the line has been read entirely, the switch 46 can be rendered conducting by means of a $\phi_1$ pulse, as a result of which the low input signal is also supplied to the transistor 46 and this transistor passes from the conducting to the non-conducting state. Current can now flow no longer through the stage 80 and the point D now supplies the signal M' to the electrode 12, which then acts as an integration gate during the following integration period. At the same time, a corresponding change in state occurs at the point C, as a result of which the transistor 87 of the stage 81 passes from the non-conducting to the conducting state, so that the chain 87–84 becomes conducting. The chain 85–86 of the stage 81 remains non-conducting because the switch 46 between the stages 80 and 81 is non-conducting.

The points C and D both pass to M between L and H so that the line 3 at the electrode 13 can be read. The level M is now determined by the choice of the geometry of the transistors 83 and 84. The signal M at the output C is transmitted directly to the transistor 87 and can be interpreted as H by the transistor 87 by choosing M to be higher than the threshold voltage of the transistor 87. In this condition, the state of the stage 82 remains unchanged. When the line 3 has been read, the switch 46 between the stages 80 and 81 can be rendered conducting by means of a $\phi_2$ pulse, as a result of which D and C of the stage 81 pass to L' and L'', respectively. The electrode 13 in the line 3 acts during the following integration period again as a blocking gate. Due to the fact that the signal L'' also passes to the transistor 87 of the stage 82, this transistor passes from the conducting to the nonconducting state, as a result of which the point D of the stage 82 passes from L' to M and the line of the matrix associated with the electrode 14 can be read.

It will be appreciated that the invention is not limited to the embodiments described herein, but that within the scope of the invention many variations are possible for those skilled in the art. For example, the vertical register 9 may be replaced by an elongate zone, which constitutes a common output diode for the lines 2–7.

What is claimed is:

1. A charge coupled line transfer image sensor having improved resolution comprising:
    a semiconductor body;
    a plurality of adjacent parallel charge coupled devices formed at a surface of said body, each device of said plurality of devices forming a line of spaced-apart photo-sensitive elements;
    a plurality of electrodes, each electrode associated with one of n-phases at a time, each photo-sensitive element lying at least partially under electrodes associated with a first phase and another phase;
    means for selectively biasing the electrodes associated with said first phase during recording of a radiation image in a first mode selectively to create potential barriers in the body under said electrodes associated with the first phase between adjacent photo-sensitive elements in said line or in a second mode to create potential barriers in the body between said electrodes associated with said first phase whereby adjacent photosensitive elements can be selectively laterally shifted to improve the resolution of the image sensor.

2. The image sensor of claim 1 wherein said means for biasing said electrodes comprises means for biasing electrodes associated with adjacent lines of photosensitive elements in said first and said second modes respectively.

3. The image sensor of claim 2 comprising means operative during sequentially recording and reading a series of images for reversing the biasing of the electrodes associated with adjacent lines of photosensitive elements when recording successive images.

4. The image sensor of any claims 1, 2 or 3 wherein said means for selectively biasing said electrodes comprises a shift register.

5. The image sensor of claim 4 comprising means for reading two adjacent lines of photosensitive elements simultaneously in time division multiplex fashion.

* * * * *